(12) United States Patent
Jung et al.

(10) Patent No.: US 6,333,252 B1
(45) Date of Patent: Dec. 25, 2001

(54) LOW-PIN-COUNT CHIP PACKAGE AND MANUFACTURING METHOD THEREOF

(75) Inventors: Kyujin Jung, Kyunggi-do; Kun-A Kang, Seoul, both of (KR)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/478,008

(22) Filed: Jan. 5, 2000

(51) Int. Cl.[7] .................................................. H01L 21/44
(52) U.S. Cl. ..................... 438/612; 438/438; 438/118; 438/124; 438/126; 438/127; 438/617
(58) Field of Search .................................. 438/112, 113, 438/115, 123, 126, 127, 118, 119, 124, 612, 617, 106; 257/784, 786, 783, 787, 780, 782

(56) References Cited

U.S. PATENT DOCUMENTS

| | | | |
|---|---|---|---|
| 5,200,362 | * 4/1993 | Lin et al. | 438/126 |
| 6,001,671 | * 12/1999 | Fjelstad | 438/112 |
| 6,093,584 | * 6/2000 | Fjelstad | 438/127 |
| 6,159,770 | * 12/2000 | Tetaka et al. | 438/112 |

FOREIGN PATENT DOCUMENTS

| | | |
|---|---|---|
| 03094430 | * 4/1991 | (JP) . |
| 03094459 | * 4/1991 | (JP) . |
| 03178152 | * 8/1991 | (JP) . |
| 05129473 | * 5/1993 | (JP) . |

OTHER PUBLICATIONS

R.O.C. Publication No. 348306 entitled "Device Having Resin Package and Method of Producing the Same".

* cited by examiner

*Primary Examiner*—Olik Chaudhuri
*Assistant Examiner*—Alonzo Chambliss

(57) ABSTRACT

A low-pin-count chip package including a die pad for receiving a semiconductor chip and a plurality of connection pads electrically coupled to the semiconductor chip. The semiconductor chip, the die pad, and the connection pads are encapsulated by a package body in a manner that the lower surfaces of the die pad and the connection pads are exposed through the package body. The present invention is characterized in that the die pad and the connection pads have a T-shaped profile thereby prolonging the time for moisture diffusion into the package as well as enhancing the "locking" of the die pad and the connection pads in the package body. The present invention further provides a method of producing the low-pin-count chip package described above.

8 Claims, 6 Drawing Sheets

260

270

260

270

260

US 6,333,252 B1

LOW-PIN-COUNT CHIP PACKAGE AND MANUFACTURING METHOD THEREOF

BACKGROUND OF THE INVENTION

1. Field of the Invention

This invention relates to semiconductor chip packages, and more specifically to low-pin-count chip packages and manufacturing methods thereof.

2. Description of the Related Art

FIG. 1 is a low-pin-count chip package 100 according to a preferred embodiment disclosed in R. 0. C. Publication No. 348306 entitled "Device Having Resin Package And Method Of Producing The Same". The low-pin-count chip package 100 includes a chip 110 sealed in a package body 120. The active surface of the chip 110 is provided with a plurality of bonding pads 110a electrically connected to a plurality of connection pads 130. The backside surface of the chip 110 is exposed from the package body 120 through a conductive adhesive layer 112. The connection pads 130 are located around the periphery of the chip 110 and exposed from the lower surface of the package body 120 for making external electrical connection. Since the package body 120 does not cover the exposed lower surface of the connection pads 130, it cannot firmly lock the connection pads 130.

The connection pads 130 are usually made of metal with good electrical conductivity such as copper but the package body 120 is made of insulating material such as epoxy molding compound. Accordingly, the bond between connection pads 130 and the package body 120 is relatively weak and the difference of the coefficient of thermal expansion (CTE) therebetween is very large. Because of the CTE mismatch, stress is created at the interface between the connection pads and the plastic package body as the conventional package experiences temperature changes. The stress, in turn, results in the delamination of the metal-plastic interface. After the plastic-metal interface becomes delaminated, moisture from the environment diffuses through the plastic package body to the delaminated area. Once moisture accumulates in the package, rapid temperature increases will cause the moisture to vaporize and expand, thereby creating an internal pressure in the delaminated area which causes the surrounding plastic package body to crack. The most common occurrence of package cracking occurs when the conventional package described above is soldered to a substrate by IR reflow.

Further, since the package body 120 only seals one side of the chip 110, moisture and/or ionic contamination from the atmosphere can sometimes penetrate through the bonding lines between the epoxy molding compound and the chip 110, which can cause reliability problems, i.e. a greatly reduced chip operating life. This phenomenon is becoming more and more critical as the semiconductor industry moves towards packaging electronic devices in smaller and smaller packages.

SUMMARY OF THE INVENTION

The present invention therefore seeks to provide a low-pin-count chip package which overcomes, or at least reduces the above-mentioned problems of the prior art.

Accordingly, in a first aspect, the present invention provides a low-pin-count chip package including a die pad for receiving a semiconductor chip and a plurality of connection pads electrically coupled to the semiconductor chip. A package body is formed over the semiconductor chip and the connection pads in a manner that the lower surfaces of the die pad and the connection pads are exposed through the package body. The present invention is characterized in that the die pad and the connection pads have a T-shaped profile thereby prolonging the path and time for moisture diffusion into the package as well as enhancing the "locking" of the die pad and the connection pads in the package body.

According to a second aspect, this invention further provides a method of producing a low-pin-count chip package. The method comprises the steps of: (A) forming a photoresist layer on a metal plate; (B) photoimaging and developing the photoresist layer so as to expose predetermined portions of the metal plate; (C) forming a protective metal flash on the exposed portions of the metal plate; (D) overplating a layer of conductive material on the protective metal flash so as to form a die pad and a plurality of connection pads having a T-shaped profile, wherein the "overplating" means that the plating of the conductive material is not stopped until the thickness thereof is greater than that of the photoresist layer; (E) forming a metal coating on the exposed surfaces of the die pad and the connection pads; (F) stripping the photoresist layer; (G) attaching a semiconductor chip onto the die pad; (H) electrically coupling the semiconductor chip to the connection pads; (I) forming a package body over the semiconductor chip and the connection pads; and (J) removing the metal plate.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
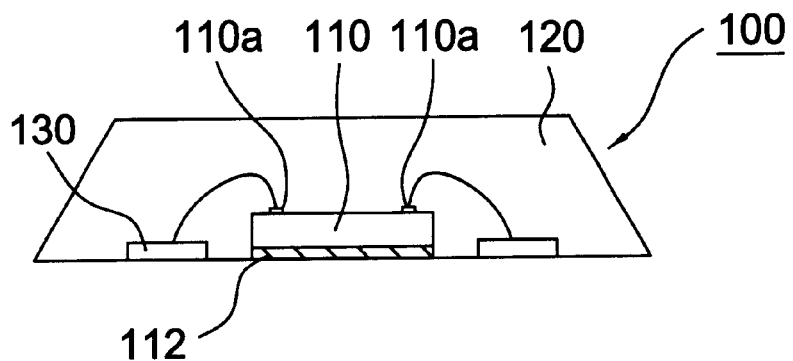
FIG. 1 is a cross-sectional view of a low-pin-count chip package according to a preferred embodiment disclosed in R. 0. C. Publication No. 348306 entitled "Device Having Resin Package And Method Of Producing The Same"
Figure 2:
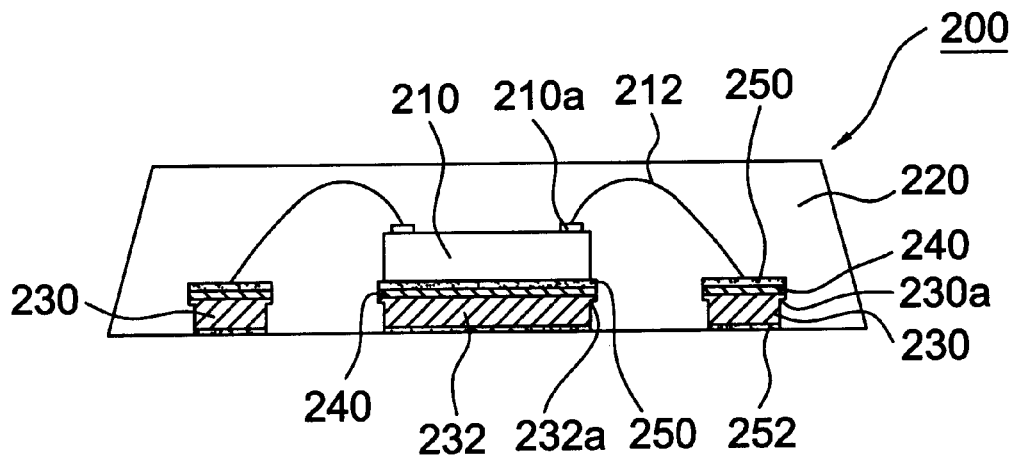
FIG. 2 is a cross-sectional view of a low-pin-count chip package according to a first embodiment of the present invention.

FIG. 2 discloses a low-pin-count chip package 200 in accordance with a first embodiment of the present invention comprising a chip 210 attached to a die pad 232 by a conductive adhesive layer, e.g., silver paste (not shown). The active surface of the chip 210 is provided with a plurality of bonding pads 210a electrically connected to connection pads 230 through bonding wires 212. The connection pads 230 are arranged about the periphery of the die pad 232. The connection pads 230 and the die pad 232 are exposed from the bottom of the package body 220 and both of them have a T-shaped profile for prolonging the path and time for moisture diffusion into the package 200 as well as enhancing the "locking" of the die pad 230 and the connection pads 232 into predetermined place in the package body 220. A package body 220 is formed over the semiconductor chip 210 and the connection pads 230 in a manner that the lower surfaces of the die pad and the connection pads are exposed through the package body 220.

Preferably, the upper surfaces of the die pad 232 and the connection pads 230 are provided with a metal coating formed thereon. The metal coating on the connection pads allows a good bond to be formed with the bonding wires 212. The metal coating typically comprises a layer of nickel 240 substantially covering the upper surfaces of the die pad 232 and the connection pads 230, and a layer of gold (or palladium) 250 covering the nickel layer 240. The lower surfaces of the die pad 232 and the connection pads 230 have a protective metal flash 252 formed thereon. Preferably, the protective metal flash 252 comprises a layer of nickel covering the lower surfaces of the die pad 232 and the connection pads 230, and a layer of gold (or palladium) covering the nickel layer. The protective metal flash 252 prevents the die pad 232 and the connection pads 230 from corrosion.

The chip package 200 can be mounted onto a substrate, such as a printed circuit board (PC board), like other leadless devices. For example, a PC board is screen printed with a solder paste in a pattern which corresponds to the pattern of the connection pads 230 exposed from the bottom surface of the package 200. The package 200 is then appropriately positioned on the PC board and the solder is reflowed. It should be understood that the connection pads 230 exposed from the bottom surface of the package 200 can be printed with solder paste and then mounted onto a substrate.

FIGS. 3–10 show a method of making the low-pin-count chip package 200 according to a first embodiment of the present invention.

Figure 3:
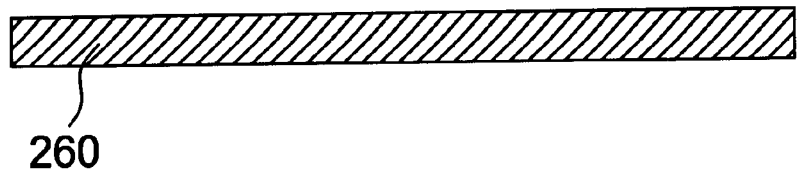
FIGS. 3–10 illustrate a method of making a low-pin-count chip package according to a first embodiment of the present invention.

FIG. 3 illustrates a metal plate 260 preferably made of copper. The purpose of the metal plate is used to support the semiconductor chip 210 during the assembly process for producing the low-pin-count chip package 200.

Figure 4:
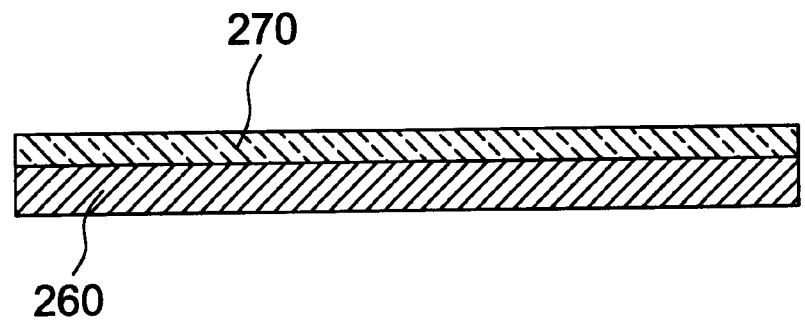

Referring to FIG. 4, a photoresist layer 270 is formed on the metal plate 260 by conventional techniques such as spin coating. The photoresist layer 270 is mainly composed of a resin mixture, and a photoactive material which makes the photoresist layer 270 photodefinable.

Figure 5:
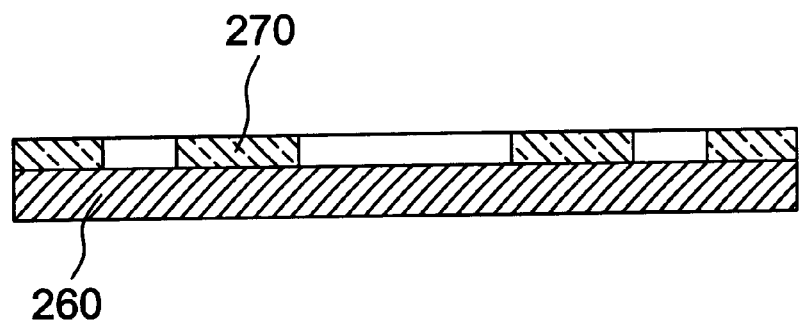

Referring to FIG. 5, the photoresist layer 270 is photochemically defined through a photomask (not shown) and developed to expose predetermined portions of the metal plate 260.

Figure 6:
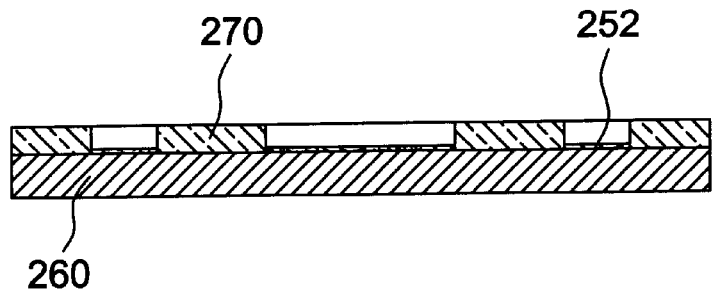

Referring to FIG. 6, a protective metal flash 252 is plated on the exposed portions of the metal plate 260 by using conventional techniques. Preferably, the protective metal flash 252 comprises a layer of gold (or palladium) covering the exposed portions of the metal plate 260, and a layer of nickel covering the gold (or palladium) layer. The metal flash 252 protects the die pad 232 and the connection pads 230 from etching agents during the removal of the metal plate 260 described below.

Figure 7:
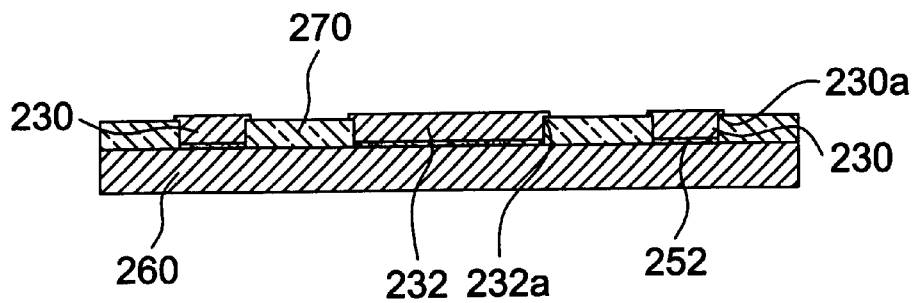

Referring to FIG. 7, the die pad 232 and the connection pads 230 are formed by "overplating" a layer of conductive material (preferably copper) on the protective metal flash 252. The "overplating" means that the conductive material is plated until the thickness thereof is greater than that of the photoresist layer 270, i.e., the plating of the conductive material continues after filling the openings of the photoresist layer 270 such that the die pad 232 and the connection pads 230 have a T-shaped profile.

Figure 8:
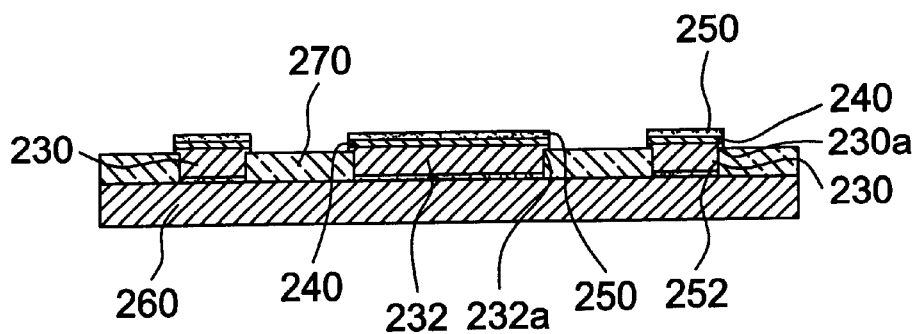

Referring to FIG. 8, the metal coating including a layer of nickel 240 and a layer of gold (or palladium) 250 are formed on the exposed surfaces of the die pad 232 and the connection pads 230 by using conventional plating techniques. Firstly, the nickel layer is plated on the exposed surfaces of the die pad 232 and the connection pads 230 and then the gold (or palladium) layer is plated on the nickel layer. Since the metal coating is also formed on the connection pads 230 adapted for electrical connecting to the chip 210, the metal coating should be formed of materials that allow a good bond to the conventional bonding wire material.

Figure 9:
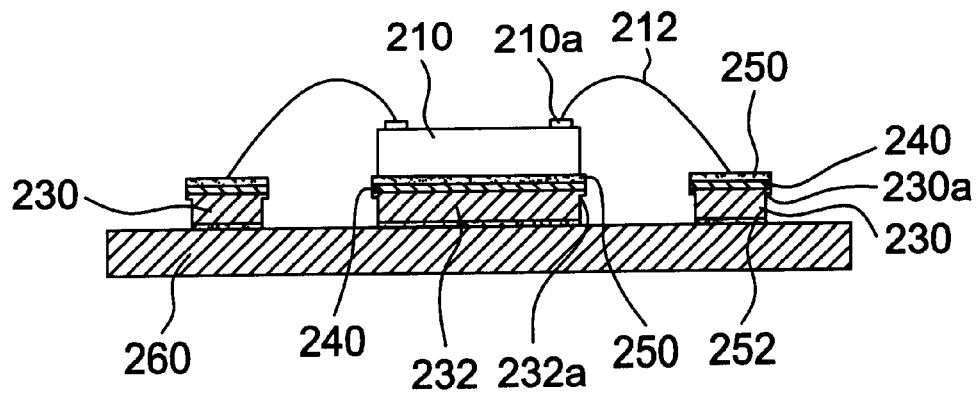

Referring to FIG. 9, the photoresist layer 270 is stripped by conventional methods and then the backside surface of the semiconductor chip 210 is securely attached onto the die pad 232 through an adhesive layer such as silver paste (not shown). The bonding wires 212 are connected to the bonding pads 210a on the chip 210 and the connection pads 230 using known wire bonding techniques.

Figure 10:
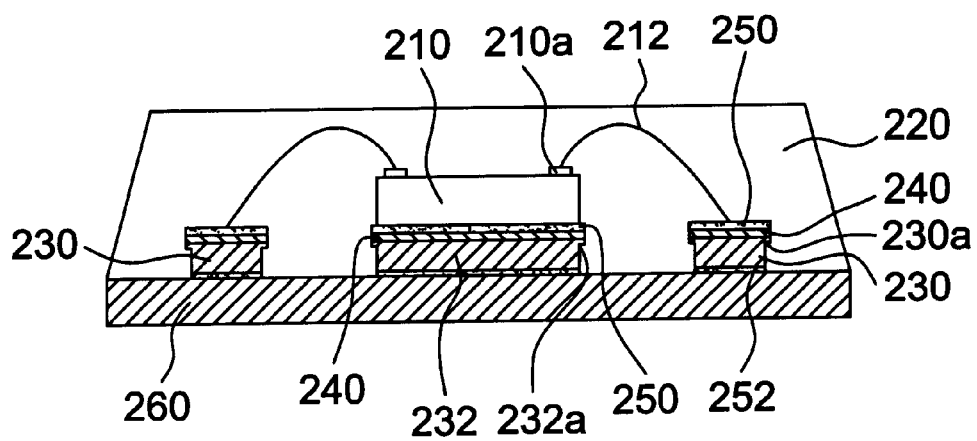

Referring to FIG. 10, the package body 220 is formed over the metal plate 260, the connection pads 230 and the semiconductor chip 210 using known plastic molding methods such as transfer molding. During the curing process, the molding compound shrinks and imposes tension stress on the corner 232a of the die pad 232 and the corner 230a of the connection pads 230. Thus, the die pad 232 and the connection pads 230 are locked in position by the hardened molding compound.

Finally, a separation process is taken to remove the metal plate 260 thereby obtaining the low-pin-count chip package 200 as shown in FIG. 2. The separation process typically is done by utilizing an etching agent to selectively dissolve the metal plate 260. And the protective metal flash 252 can help to prevent the die pad 232 and the connection pads 230 from being etched.

Figure 11:
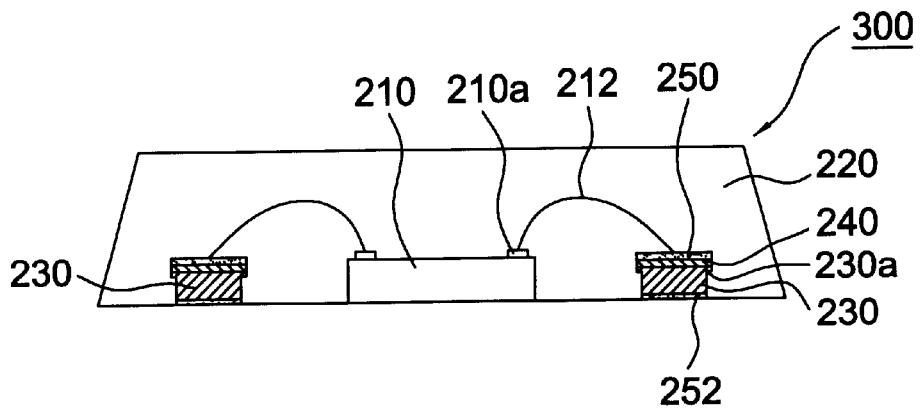
FIG. 11 is a cross-sectional view of a low-pin-count chip package according to a second embodiment of the present invention.

FIG. 11 discloses a low-pin-count chip package 300 in accordance with a second embodiment of the present invention comprising a chip 210 sealed in a package body 220. The chip package 300 is substantially identical to the chip package 200 of FIG. 2 with exception that the die pad 232 is skipped and the backside surface of the semiconductor chip 210 is substantially exposed from the package body 220 through an adhesive layer (not shown).

Figure 12:
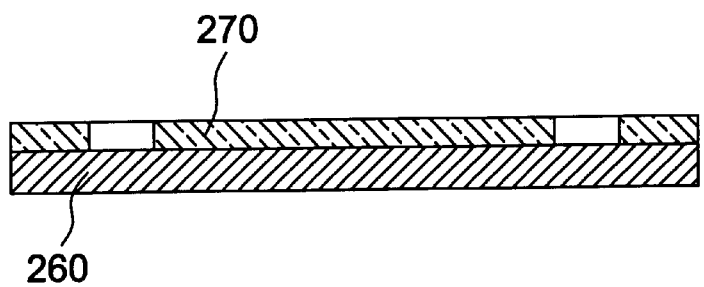
FIGS. 12–14 illustrate a method of making a low-pin-count chip package according to a second embodiment of the present invention.
Figure 13:
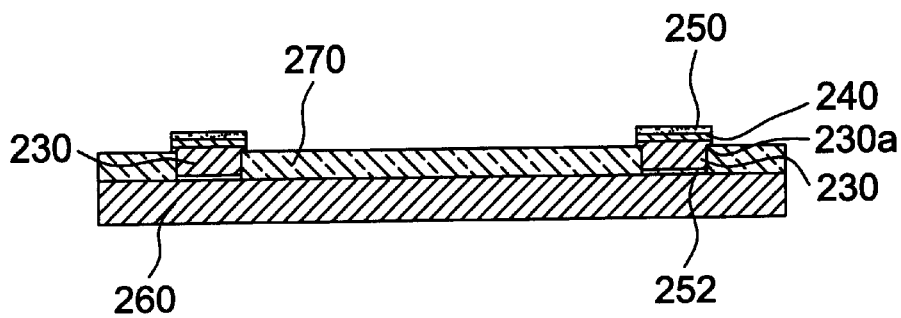
Figure 14:
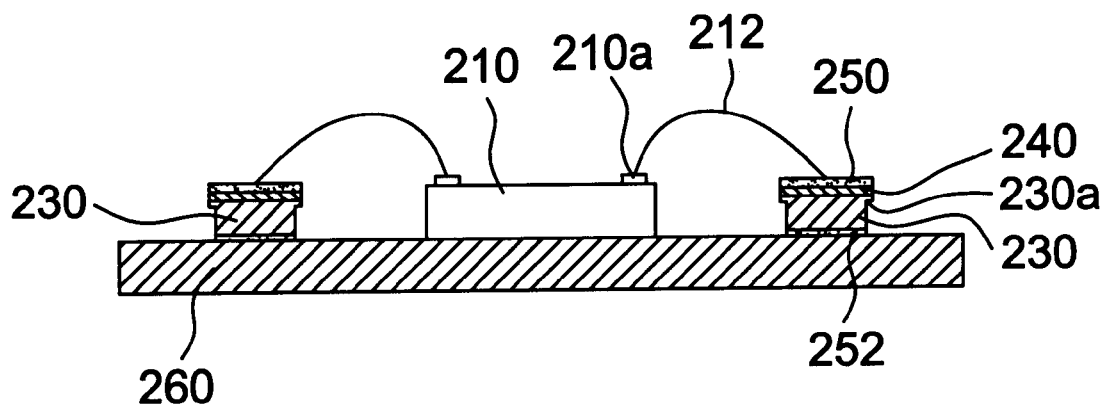

FIGS. 12–14 illustrate a method of making the low-pin-count chip package 300 according to a second embodiment of the present invention.

Referring to FIG. 12, a photoresist layer 270 is formed on the metal plate 260, photochemically defined through a mask (not shown) and developed to expose areas on the metal plate 260 corresponding to the connections pads 230.

Referring to FIG. 13, the protective metal flash 252 is plated on the exposed areas of the metal plate 260, and then the connection pads 230 having a T-shaped profile are formed by "overplating" a layer of conductive material on the protective metal flash 252. After that, the metal coating including a layer of nickel 240 and a layer of gold (or palladium) 250 are formed on the exposed surfaces of the connection pads 230.

Referring to FIG. 14, the photoresist layer 270 is stripped and then the backside surface of the semiconductor chip 210 is securely attached onto the die attaching area of the metal plate 260 surrounding by the connection pads 230 using an adhesive layer(not shown). After wire bonding, the package body 220 is formed over the metal plate 260, the connection pads 230 and the semiconductor chip 210 using known plastic molding methods. Finally, a separation process is taken to remove the metal plate 260 thereby obtaining the low-pin-count chip package 300 as shown in FIG. 11.

According to the present invention, the die pad and the connection pads are formed by overplating in order to have a T-shaped profile thereby increasing the moisture path to minimize the effect of or prolong the time for moisture diffusion to the functional areas in the package. Further, the T-shaped profile of the die pad and the connection pads helps to hold the die pad and the connection pads in position thereby enhancing the "locking" of the die pad and the connection pads in the package body.

Although the invention has been explained in relation to its preferred embodiment, it is to be understood that many other possible modifications and variations can be made without departing from the spirit and scope of the invention as hereinafter claimed.

What is claimed is:

1. A method of making a low-pin-count chip package provided with a plurality of connection pads having a T-shaped profile, said method comprising the steps of providing a metal plate;

forming a photoresist layer on the metal plate;

photoimaging and developing the photoresist layer so as to form a pattern such that areas on the metal plate where the connection pads are to be formed are exposed from the photoresist layer;

forming a protective metal flash on the exposed areas of the metal plate;

overplating a layer of conductive material on the metal flash, using the patterned photoresist layer as a mask, so as to form the connection pads;

forming a metal coating on the connection pads;

stripping the photoresist layer from the metal plate;

attaching a semiconductor chip onto the metal plate;

electrically coupling the semiconductor chip to the connection pads located at the periphery of the chip;

forming a package body over the semiconductor chip and the connection pads wherein the T-shaped profile helps to lock the connection pads in the package body; and removing the metal plate from the package body.

2. The method as claimed in claim 1, wherein the protective metal flash comprises a layer of metal selected from the group consisted of gold and palladium covering the exposed portions of the metal plate, and a layer of nickel covering the layer of metal selected from the group consisted of gold and palladium.

3. The method as claimed in claim 1, wherein the metal plate is made of copper.

4. The method as claimed in claim 1, wherein the metal coating comprises a layer of nickel covering the surface of the connection pads which are not covered by the photoresist layer, and a layer of metal selected from the group consisted of gold and palladium covering the nickel layer.

5. A method of making a low-pin-count chip package provided with a die pad and a plurality of connection pads having a T-shaped profile, said method comprising the steps of:

providing a metal plate;

forming a photoresist layer on the metal plate;

photoimaging and developing the photoresist layer so as to form a pattern such that areas on the metal plate where the die pad and the connection pads are to be formed are exposed from the photoresist layer;

forming a protective metal flash on the exposed areas of the metal plate;

overplating a layer of conductive material on the metal flash so as to form the die pad and the connection pads;

forming a metal coating on the die pad and the connection pads;

stripping the photoresist layer from the metal plate;

attaching a semiconductor chip onto the die pad;

electrically coupling the semiconductor chip to the connection pads located at the periphery of the chip;

forming a package body over the semiconductor chip and the connection pads wherein the T-shaped profile helps to lock the die pad and the connection pads in the package body; and removing the metal plate from the package body.

6. The method as claimed in claim 5, wherein the protective metal flash comprises a layer of metal selected from the group consisted of gold and palladium covering the exposed portions of the metal plate, and a layer of nickel covering the layer of metal selected from the group consisted of gold and palladium.

7. The method as claimed in claim 5, wherein the metal plate is made of copper.

8. The method as claimed in claim 5, wherein the metal coating comprises a layer of nickel covering the surfaces of the die pad and the connection pads which are not covered by the photoresist layer, and a layer of metal selected from the group consisted of gold and palladium covering the nickel layer.

* * * * *